US006329302B1

(12) United States Patent
Francis

(10) Patent No.: US 6,329,302 B1
(45) Date of Patent: Dec. 11, 2001

(54) REMOVAL OF A TOP IC DIE FROM A BOTTOM IC DIE OF A MULTICHIP IC PACKAGE WITH PRESERVATION OF INTERCONNECT

(75) Inventor: Caroline M. Francis, Penang (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 10 days.

(21) Appl. No.: 09/603,274

(22) Filed: Jun. 26, 2000

(51) Int. Cl.$^7$ ..................................................... H01L 21/00
(52) U.S. Cl. ........................... 438/749; 216/95; 438/750; 438/751
(58) Field of Search ..................................... 438/745, 749, 438/750, 751; 216/83, 91, 95, 99

(56) References Cited

U.S. PATENT DOCUMENTS 4,585,513 * 4/1986 Gale et al. .......................... 438/750

* cited by examiner

Primary Examiner—William A. Powell

(74) Attorney, Agent, or Firm—Monica H. Choi

(57) ABSTRACT

A top IC die is removed from a bottom IC die in a multichip IC package while substantially preserving interconnect of the bottom IC die for proper fault isolation during testing of the multichip IC package. The top IC die is attached to the bottom IC die with a die attach material within the multichip IC package. The top IC die has a first area that is smaller than a second area of the bottom IC die, and the top IC die is disposed inward from any edge of the bottom IC die such that a perimeter area of the bottom IC die is outside the top IC die. A predetermined area of the top IC die is exposed with the predetermined area being smaller than the first area of the top IC die. The predetermined area is disposed inward from any edge of the top IC die. The first area of the top IC die outside the predetermined area remains covered, and the perimeter area of the bottom IC die remains covered. The predetermined area of the top IC die that is exposed is etched until the die attach material is exposed within the predetermined area. The first area of the top IC die outside the predetermined area forms a top IC die skeleton, and the die attach material between the top IC die skeleton and the bottom IC die readily etches in an etching solution after a relatively short time period for complete removal of the top IC die from the bottom IC die such that interconnect structures of the bottom IC die are substantially preserved.

13 Claims, 7 Drawing Sheets

REMOVAL OF A TOP IC DIE FROM A BOTTOM IC DIE OF A MULTICHIP IC PACKAGE WITH PRESERVATION OF INTERCONNECT

TECHNICAL FIELD

The present invention relates generally to manufacture of IC (integrated circuit) packages, and more particularly, to a method for removing a top IC (integrated circuit) die from a bottom IC (integrated circuit) die of a multichip IC package with preservation of interconnect of the bottom IC die such that fault isolation testing may be performed on the bottom IC die.

BACKGROUND OF THE INVENTION

As hand-held portable electronic devices such as cellular phones and palm computers are becoming more prevalent, conservation of chip space is an important consideration for designing IC (integrated circuit) packages to be used in such hand-held portable devices. A technique for conserving chip space is the use of a multichip IC (integrated circuit) package having a plurality of IC (integrated circuit) dies that are stacked.

Referring to FIG. 1, a top IC (integrated circuit) die 102 is stacked on top of a bottom IC die 104. The top IC die 102 has a plurality of bonding pads including a first bonding pad 112, a second bonding pad 114, a third bonding pad 116, a fourth bonding pad 118, a fifth bonding pad 120, and a sixth bonding pad 122 for providing connection to nodes of the integrated circuit of the top IC die 102. The bottom IC die 104 also has a plurality of bonding pads including a first bonding pad 132, a second bonding pad 134, a third bonding pad 136, a fourth bonding pad 138, a fifth bonding pad 140, and a sixth bonding pad 142 for providing connection to nodes of the integrated circuit of the bottom IC die 104. IC dies typically have more numerous bonding pads, but six bonding pads are shown for the top IC die 102 and the bottom IC die 104 of FIG. 1 for clarity of illustration.

A first area of the top IC die 102 is smaller than a second area of the bottom IC die 104 such that the bonding pads of the bottom IC die 104 are exposed for providing connection to nodes of the integrated circuit of the bottom IC die 104. In addition, the top IC die 102 is disposed inward from any edge of the bottom IC die 104 such that a perimeter area 150 of the bottom IC die 104 is exposed outside the first area of the top IC die 102. The bonding pads of the bottom IC die 104 are disposed at the perimeter area 150 of the bottom IC die 104 such that the bonding pads of the bottom IC die 104 are exposed.

The top IC die 102 is attached to the bottom IC die 104 with a die attach material. Referring to FIG. 2, a cross sectional view of a multichip IC package 200 having the top IC die 102 stacked on the bottom IC die 104 across line A—A in FIG. 1 is shown. The bottom IC die 104 is attached to a support frame 202 of the multichip IC package 200 with a die attach material 204. The bottom IC die 104 typically has a topside passivation layer 206 for protecting integrated circuit structures fabricated on the bottom IC die 104. The top IC die 102 is attached to the bottom IC die 104 with a die attach material 208. The top IC die 102 also typically has a topside passivation layer 210 for protecting integrated circuit structures fabricated on the top IC die 102.

A first conductive ball 212 is bonded to the second bonding pad 114 of the top IC die 102 for providing connection between the second bonding pad 114 and a lead of the multichip IC package 200. A second conductive ball 214 is bonded to the fifth bonding pad 120 of the top IC die 102 for providing connection between the fifth bonding pad 114 and a lead of the multichip IC package 200. A third conductive ball 216 is bonded to the second bonding pad 134 of the bottom IC die 104 for providing connection between the second bonding pad 134 and a lead of the multichip IC package 200. A fourth conductive ball 218 is bonded to the fifth bonding pad 140 of the bottom IC die 104 for providing connection between the fifth bonding pad 140 and a lead of the multichip IC package 200.

The multichip IC package 200 includes a plurality of ball leads including a first ball lead 222, a second ball lead 224, and a third ball lead 226 that are each coupled to a respective bonding pad of the top IC die 102 or the bottom IC die 104. IC packages typically have more numerous leads in an array of leads, but three ball leads of one row in an array of ball leads are shown for the IC package 200 of FIG. 2 for clarity of illustration. Elements having the same reference number in FIGS. 1 and 2 refer to elements having similar structure and function. The first area of the top IC die 102 and the perimeter area 150 of the bottom IC die 104 are covered with a plastic material 230 of the multichip IC package 200. Such multichip IC package structures are known to one of ordinary skill in the art of IC package manufacture.

During manufacture of IC packages, the IC packages are tested for proper functionality of the integrated circuits of the IC dies within the IC packages. When an IC package fails testing by exhibiting improper functionality, the cause of such failure is determined through "fault isolation" techniques as known to one of ordinary skill in the art of IC package manufacture. One such fault isolation technique is the use of "photon emission microscopy" which measures photon emission from the surface of an IC die. For measurement of photon emission from an area of the IC die in this fault isolation technique, the area of the IC die is exposed.

For the multichip IC package 200 of FIGS. 1 and 2, the top IC die 102 should be removed for use of "photon emission microscopy" on areas of the bottom IC die 104 that are initially covered by the top IC die 102. Referring to FIGS. 2 and 3, for separation of the top IC die 102 from the bottom IC die 104, the die attach material 208 between the top IC die 102 and the bottom IC die 104 is etched. In the prior art, the outside edge of the top IC die 102 is exposed to an etching solution. For example, the die attach material 208 may be comprised of liquid bismaleimide resin and polytetra-fluoroethylene (PTFE) fillers, as known to one of ordinary skill in the art of IC package manufacture. In that case, the etching solution for dissolving such a die attach material may be comprised of nitric acid ($HNO_3$).

Referring to FIG. 3, when only the outside edge of the top IC die 102 is exposed to the etching solution, the contact area of the etching solution to the die attach material 208 between the top IC die 102 and the bottom IC die 104 (as illustrated by the arrows in FIG. 3) is small. Elements having the same reference number in FIGS. 1, 2, and 3 refer to elements having similar structure and function. Consequently, the time period for separation of the top IC die 102 from the bottom IC die 104 may be approximately 3 to 4 hours when the top IC die 102 has dimensions of approximately 0.29 inches by 0.27 inches for example. When the top IC die 102 and the bottom IC die 104 are exposed to the etching solution for such a long time period, the bonding pads of the IC dies 102 and 104 may be undesirably etched and destroyed.

However, interconnect of the bottom IC die 104 should be preserved for proper fault isolation testing of the bottom IC die 104.

SUMMARY OF THE INVENTION

Accordingly, in a general aspect of the present invention, a top IC die is removed from a bottom IC die in a multichip IC package while substantially preserving interconnect of the bottom IC die for proper fault isolation during testing of the multichip IC package.

The top IC die is attached to the bottom IC die with a die attach material within the multichip IC package. The top IC die has a first area that is smaller than a second area of the bottom IC die, and the top IC die is disposed inward from any edge of the bottom IC die such that a perimeter area of the bottom IC die is exposed outside the top IC die.

In one embodiment of the present invention, a predetermined area of the top IC die is exposed with the predetermined area being smaller than the first area of the top IC die. The predetermined area is disposed inward from any edge of the top IC die. The first area of the top IC die outside the predetermined area remains covered, and the perimeter area of the bottom IC die remains covered. The predetermined area of the top IC die that is exposed is etched until the die attach material is exposed within the predetermined area. The first area of the top IC die outside the predetermined area and the perimeter area of the bottom IC die are exposed, and the first area of the top IC die outside the predetermined area forms a top IC die skeleton. The die attach material exposed within the predetermined area is etched, and the die attach material between the top IC die skeleton and the bottom IC die is etched until the top IC die skeleton detaches from the bottom IC die for complete removal of the top IC die from the bottom IC die.

The present invention may be used to particular advantage when an auto-decapper is used for etching a particular area of the multichip IC package such that only that particular area of the multichip IC package is exposed to caustic etching solutions within the auto-decapper.

In this manner, when the die attach material of the top IC die skeleton is etched, a larger contact area of the die attach material is exposed for etching. Thus, the top IC die skeleton is readily detached from the bottom IC die after a shorter time period of exposure of the bottom IC die to the etching solution for dissolving the die attach material between the top IC die skeleton and the bottom IC die. With such a shorter time period of exposure to the etching solution, the bonding pads of the bottom IC die are not damaged such that interconnect of the bottom IC die is substantially preserved.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and function.

DETAILED DESCRIPTION

Figure 1:
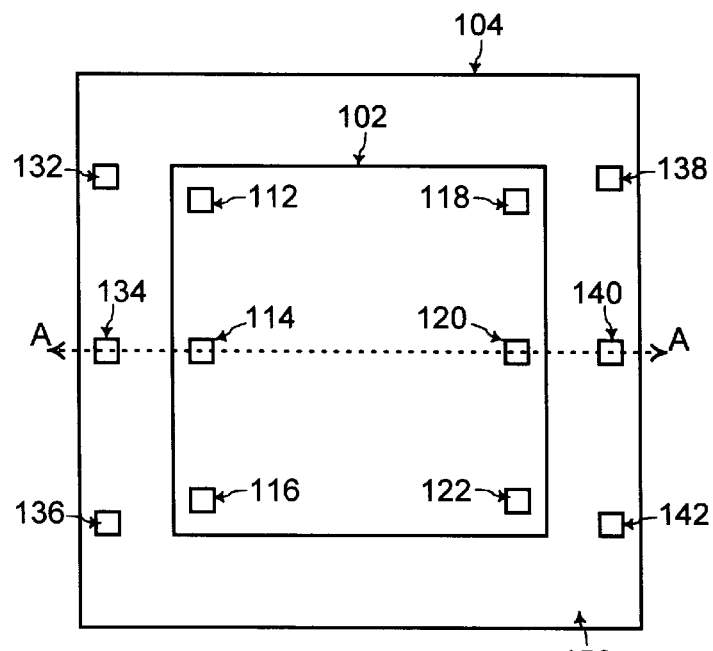
FIG. 1 shows a top view of a top IC (integrated circuit) die stacked on a bottom IC (integrated circuit) die of a multichip IC (integrated circuit) package for conserving chip space.
Figure 2:
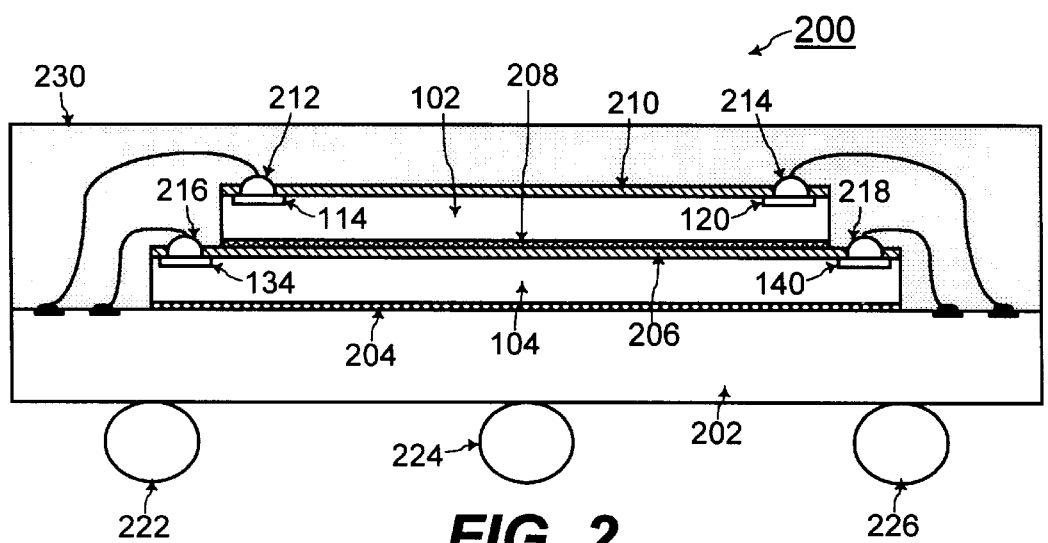
FIG. 2 shows a cross sectional view of the top IC die stacked on the bottom IC die of the multichip IC package of FIG. 1.
Figure 4:
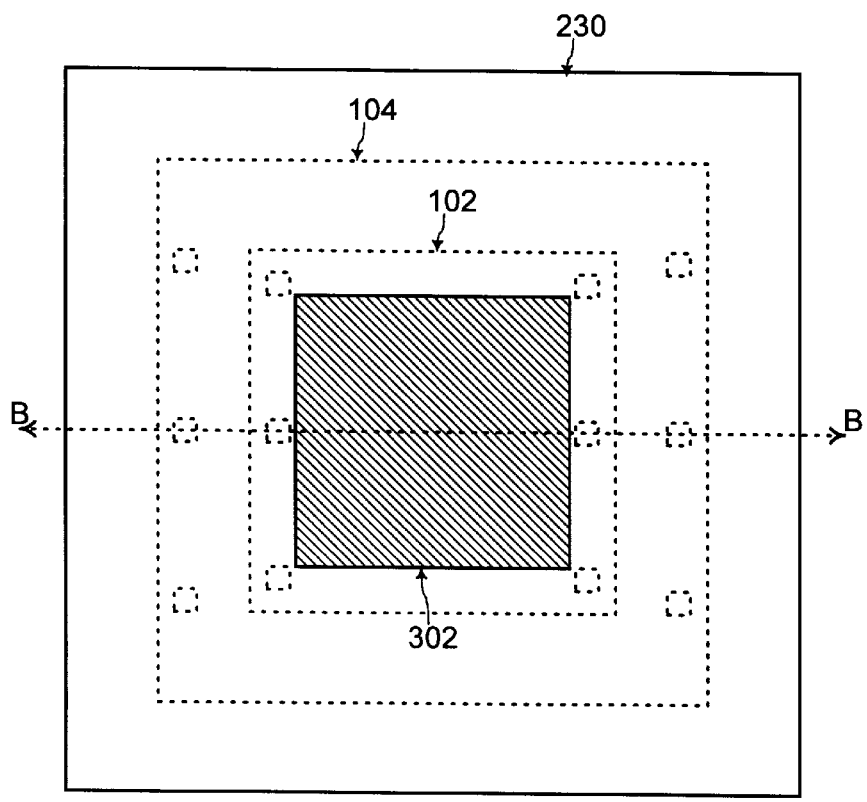
FIGS. 4, 5, 6, 7, 8, 9, 10, 11, 12, 13, 14, 15, and 16 illustrate steps for removing the top IC die from the bottom IC die of the multichip IC package of FIG. 1 while preserving interconnect of the bottom IC die by forming a top IC die skeleton that readily detaches from the bottom IC die, according to an embodiment of the present invention.

Referring to FIGS. 1 and 2, the plastic material 230 of the multichip IC package 200 initially covers the first area of the top IC die 102 and the perimeter area 150 of the bottom IC die 104. Referring to FIG. 4, the top IC die 102 and the bottom IC die 104 are outlined with dashed lines covered by the plastic material 230 of the multichip IC package 200.

According to an embodiment of the present invention, a predetermined area 302 of the top IC die 102 is exposed by removal of the predetermined area 302 of the plastic material 230 covering the top IC die 102. In one embodiment of the present invention, an auto-decapper is used for etching the predetermined area 302 of the plastic material 230 covering the top IC die 102. Auto-decappers use a gasket mechanism for defining a particular area of an IC package to be etched, as known to one of ordinary skill in the art of IC package manufacture. Substantially only that particular area of the IC package is exposed to an etching solution of acid within the auto-decapper such that other structures of the IC package are preserved. Such an auto-decapper is commercially available from B&G International, Nisene Technology Group, Inc., in Santa Cruz, Calif. Within such an auto-decapper, the predetermined area 302 of the plastic material 230 of the multichip IC package 200 is exposed to fuming sulfuric acid ($H_2SO_4$) at an etching temperature of about 200° Celsius for an etch time in a range of from about 68 seconds to about 75 seconds, according to one embodiment of the present invention.

The predetermined area 302 of the plastic material 230 of the multichip IC package 200 is etched within such an auto-decapper until the predetermined area 302 of the first IC die 102 is exposed. The predetermined area 302 is smaller than the first area of the top IC die 102, and in one embodiment of the present invention, the predetermined area 302 is about 15% to 20% smaller than the first area of the top IC die 102. The predetermined area 302 is disposed inward from any edge of the top IC die 102 such that the first area of the top IC die 102 outside the predetermined are 302 remains covered by the plastic material 230 of the multichip IC package 200. In addition, the perimeter area 150 of the bottom IC die 104 remains covered by the plastic material 230 of the multichip IC package 200.

Figure 5:
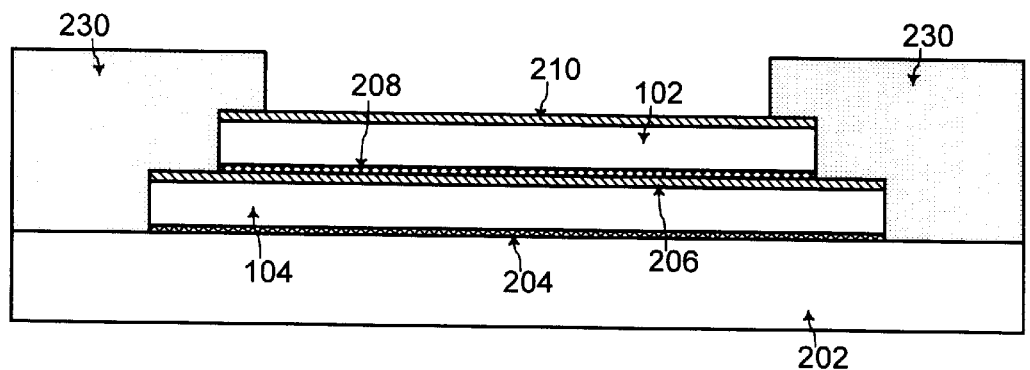

FIG. 5 shows a cross sectional view of the multichip IC package 200 along line B—B of FIG. 4 after etching of the predetermined area 302 of the plastic material 230 of the multichip IC package 200. Referring to FIGS. 4 and 5, the topside passivation layer 210 of the top IC die 102 is exposed in the predetermined area 302.

The top IC die 102 that is exposed within the predetermined area 302 is etched. The top IC die 102 includes the topside passivation layer 210 formed on integrated circuit structures fabricated on a semiconductor substrate of the top IC die 102, as known to one of ordinary skill in the art of integrated circuit fabrication. The topside passivation layer 210 typically includes silicon nitride (SiN) and/or a polyimide layer, as known to one of ordinary skill in the art of integrated circuit fabrication.

Figure 6:
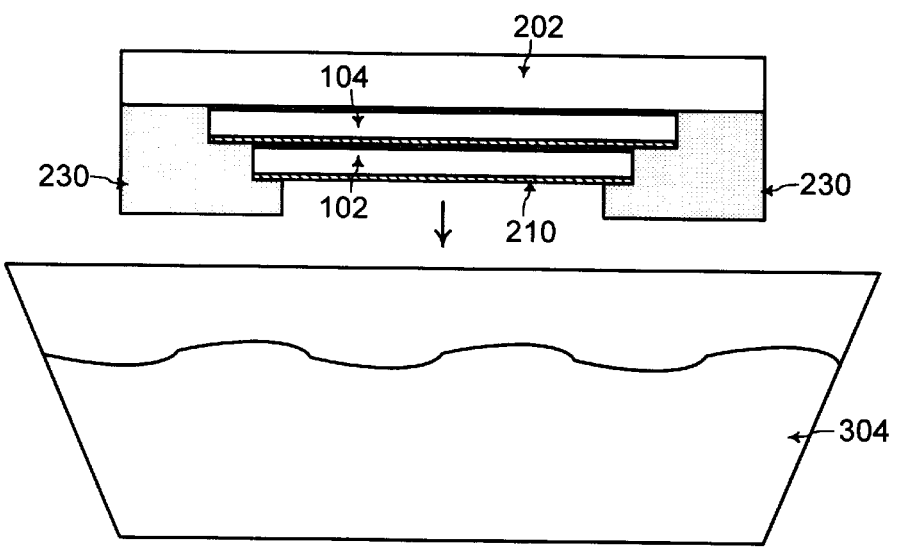

Referring to FIG. 6, in one embodiment of the present invention, the exposed area of the top IC die 102 is dipped into a bath of etching solution 304 comprised of hydrofluoric (HF) acid. In one embodiment of the present invention, the top portion of the multichip IC package 200 with the exposed area of the top IC die 102 is dipped into the bath of hydrofluoric (HF) acid 304 for approximately 3 minutes to 4 minutes such that the topside passivation layer 210 and the integrated circuit structures on the semiconductor substrate within the predetermined area 302 of the top IC die 102 are etched off as illustrated in the cross sectional view of the multichip package 200 of FIG. 7.

In an alternative embodiment of the present invention, the topside passivation layer 210 of the top IC die 102 is etched using a plasma etch process with fluorine ($CF_4$) as a reactant. Plasma etching processes are known to one of ordinary skill in the art of integrated circuit fabrication.

Figure 7:
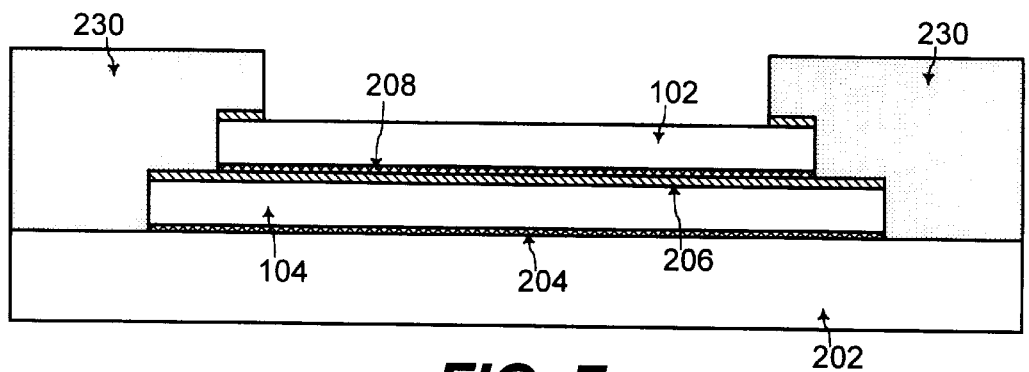
Figure 8:
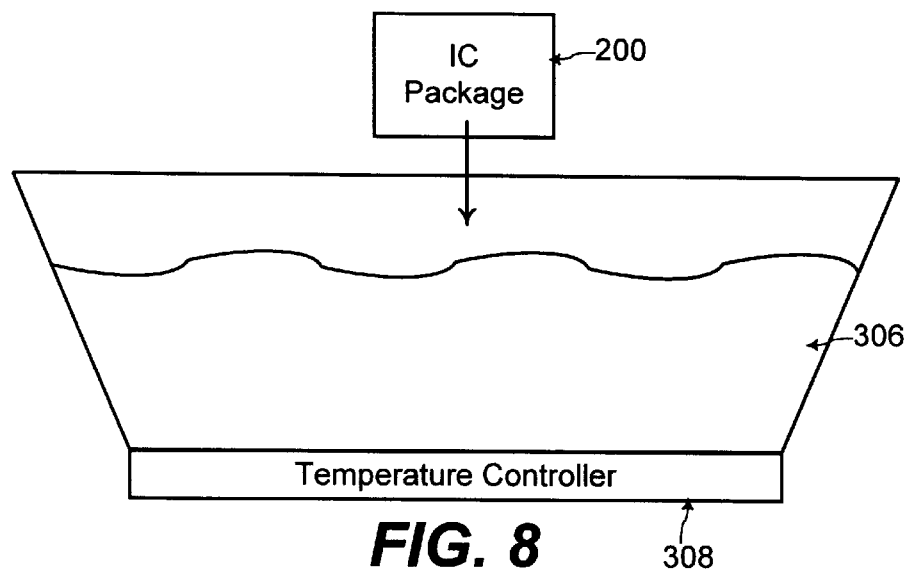
Figure 9:
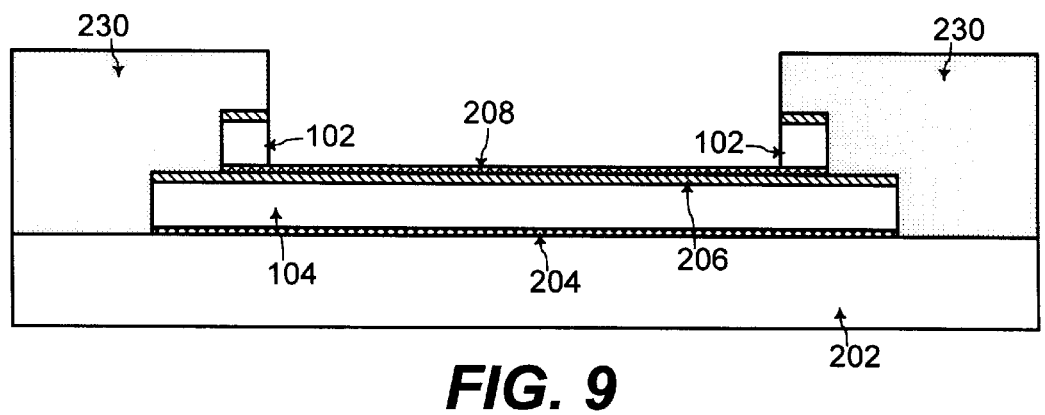

Referring to FIGS. 7 and 8, after the topside passivation layer 210 and/or the integrated circuit structures on the semiconductor substrate within the predetermined area 302 of the top IC die 102 are etched off by the bath of hydrofluoric (HF) acid 304 and/or the plasma etch with fluorine ($CF_4$), the multichip IC package 200 is immersed in a heated bath of potassium hydroxide (KOH) solution 306. A temperature controller 308 controls the temperature of the bath of potassium hydroxide (KOH) solution 306 to be in a range of from about 110° Celsius to about 120° Celsius. Referring to FIGS. 7, 8, and 9, the multichip IC package 200 is immersed in the heated bath of potassium hydroxide (KOH) solution 306 for a time period in a range of from about 30 minutes to about 45 minutes until the semiconductor substrate of the top IC die 102 is etched to expose the die attach material 208 within the predetermined area 302 when the semiconductor substrate of the top IC die 102 is comprised of silicon for example.

When the multichip IC package 200 is immersed in the heated bath of potassium hydroxide (KOH) solution 306 as described, the interconnect structures of the multichip IC package 200 are substantially preserved. In addition, the die attach material 208 that is exposed within the predetermined area 302 is substantially preserved when the multichip IC package 200 is immersed in the heated bath of potassium hydroxide (KOH) solution 306 as described. In this manner, potassium hydroxide (KOH) solution is advantageous for etching the semiconductor substrate of the top IC die 102 while preserving the interconnect structures of the multichip IC package 200 and the die attach material 208 that is exposed within the predetermined area 302.

However, the potassium hydroxide (KOH) solution does not readily etch the silicon nitride of the topside passivation layer 210. Thus, hydrofluoric acid (HF) or plasma etch with fluorine ($CF_4$) is used for etching the topside passivation layer 210 before the multichip IC package 200 is immersed in the heated bath of potassium hydroxide (KOH) solution 306. After etching of the predetermined area 302 of the top IC die 102, a top IC die skeleton of the top IC die 102 outside of the predetermined area 302 remains.

Referring to FIG. 9, the top IC die skeleton of the top IC die 102 outside of the predetermined area 302 and the perimeter area 150 of the bottom IC die 104 remain covered with the plastic material 230 of the multichip IC package 200. Thus, the potassium hydroxide (KOH) solution does not contact the sides of the bottom IC die 104 such that the semiconductor substrate of the bottom IC die 104 is not etched by the potassium hydroxide (KOH) solution.

Figure 10:
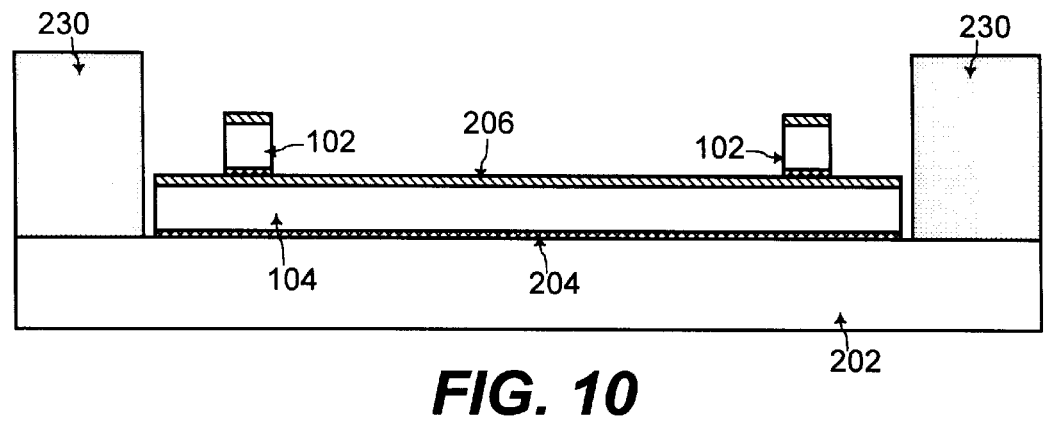

Referring to FIG. 10, the plastic material 230 of the multichip IC package 200 is etched from the top IC die skeleton of the top IC die 102 outside of the predetermined area 302 and the perimeter area 150 of the bottom IC die 104 using an auto-decapper as described herein. The gasket of the auto-decapper exposes the second area of the bottom IC die 104, and the plastic material 230 of the multichip IC package 200 within such area is exposed to fuming sulfuric acid ($H_2SO_4$) at an etching temperature of about 200° Celsius for an etch time in a range of from about 68 seconds to about 75 seconds.

With etching of the plastic material 230 of the multichip IC package 200 in this auto-decapper etch process, the top IC die skeleton of the top IC die 102 outside of the predetermined area 302 and the bottom IC die 104 are exposed. Referring to FIGS. 9 and 10, the die attach material 208 that is exposed within the predetermined area 302 may also be substantially etched off during this auto-decapper etch process.

Figure 11:
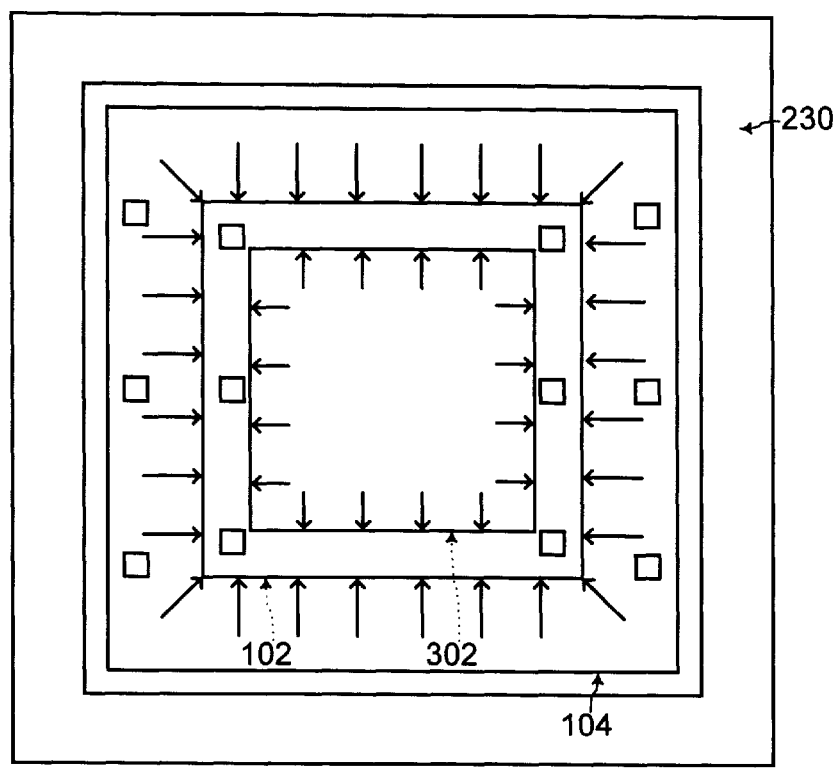
Figure 12:
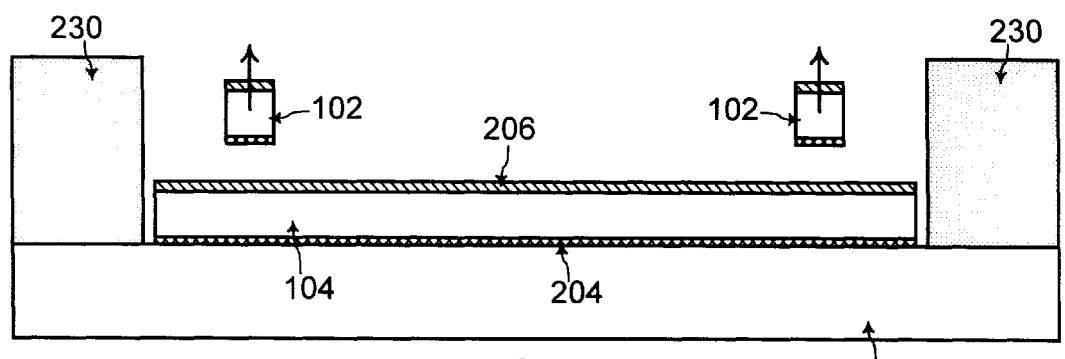

Referring to FIGS. 11 and 12, the die attach material between the top IC die skeleton and the bottom IC die 104 is etched by exposing the area of the top IC die skeleton to an etching acid. In one embodiment of the present invention, the top IC die skeleton is exposed to fuming nitric acid ($HNO_3$) at a temperature of about 90° Celsius for an etch time in a range of from about 200 seconds to about 235 seconds within an auto-decapper as described herein.

Figure 3:
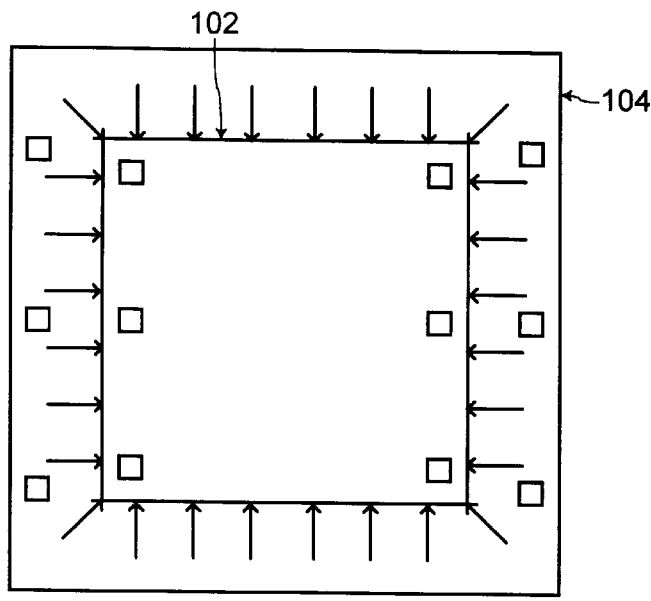
FIG. 3 illustrates separation of the top IC die from the bottom IC die by exposure of a die attach material between the top IC die and the bottom IC die only at the edge of the top IC die, according to the prior art.

Referring to FIG. 11, with the top IC die skeleton of the top IC die 102, the fuming nitric acid ($HNO_3$) etches the die attach material between the top IC die skeleton of the top IC die 102 and the bottom IC die 104 from both outside and inside of the top IC die skeleton (as illustrated by the arrows in FIG. 11). In addition, comparing FIGS. 3 and 11, the area of the die attach material to be penetrated for etching is substantially less with the formation of the top IC die skeleton in FIG. 11 such that the die attach material under the top IC die skeleton may be etched in a short time period of about 3 minutes to about 4 minutes until the top IC die skeleton detaches from the bottom IC die 104 as illustrated in FIG. 12 (for the example of the top IC die 102 having dimensions of approximately 0.29 inches by 0.27 and the predetermined area 302 being about 15% to 20% smaller than the dimensions of the top IC die 102).

Figure 13:
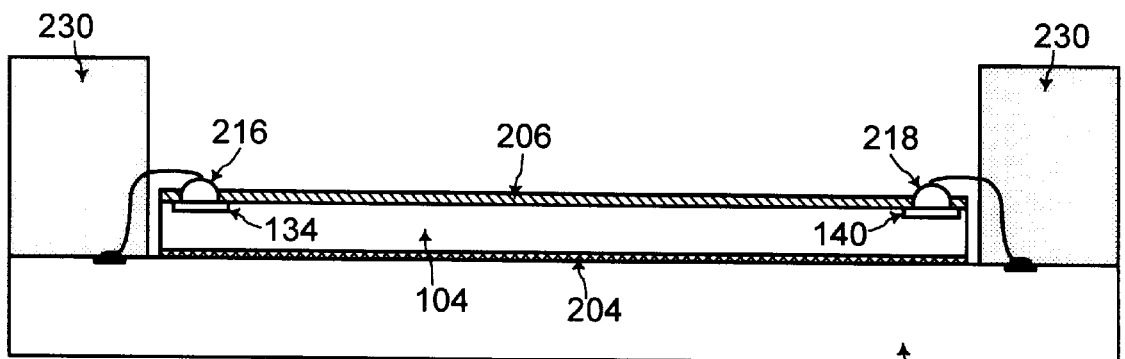
Figure 14:
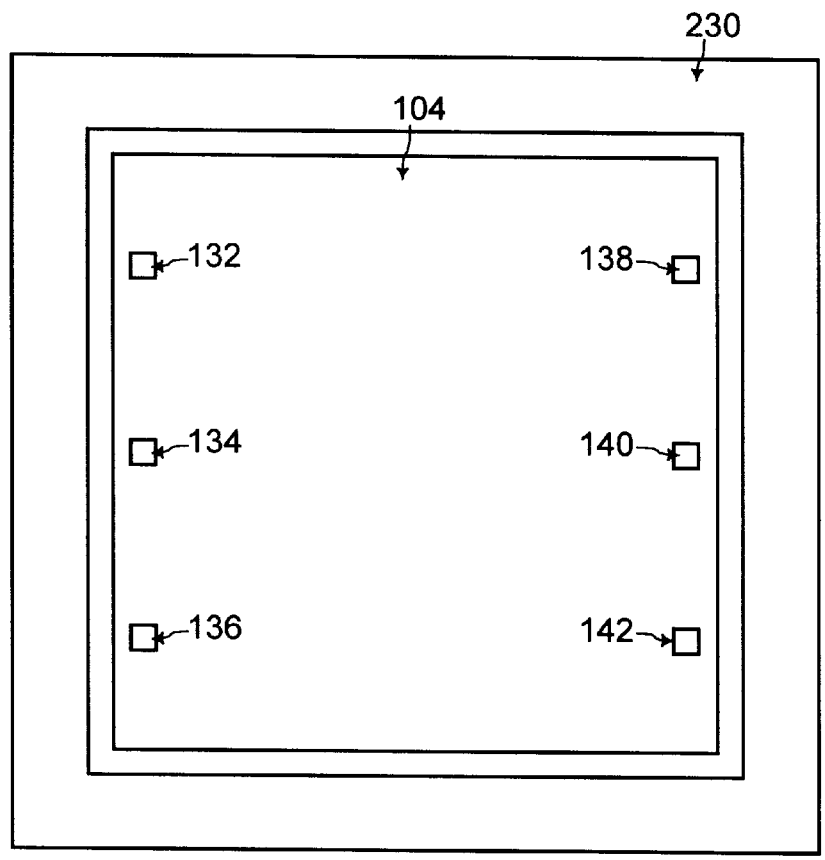

Referring to FIG. 13, with such a short time period of exposure of the bottom IC die 104 to the fuming nitric acid ($HNO_3$) for removal of the top IC die skeleton from the bottom IC die 104, interconnect structures such as the bonding pads 132, 134, 136, 138, 140, and 142 of the bottom IC die 104 are substantially preserved such that proper fault isolation may be determined for the bottom IC die 104. (Interconnect structures of the top IC die 102 and the bottom IC die 104 are not shown in FIGS. 5, 6, 7, 9, 10, and 12 for clarity of illustration.) Referring to FIG. 14, with removal of the top IC die skeleton from the bottom IC die 104, the area of the bottom IC die 104 is exposed such that "photo emission microscopy" testing may be performed on the surface area of the bottom IC die 104.

Figure 15:
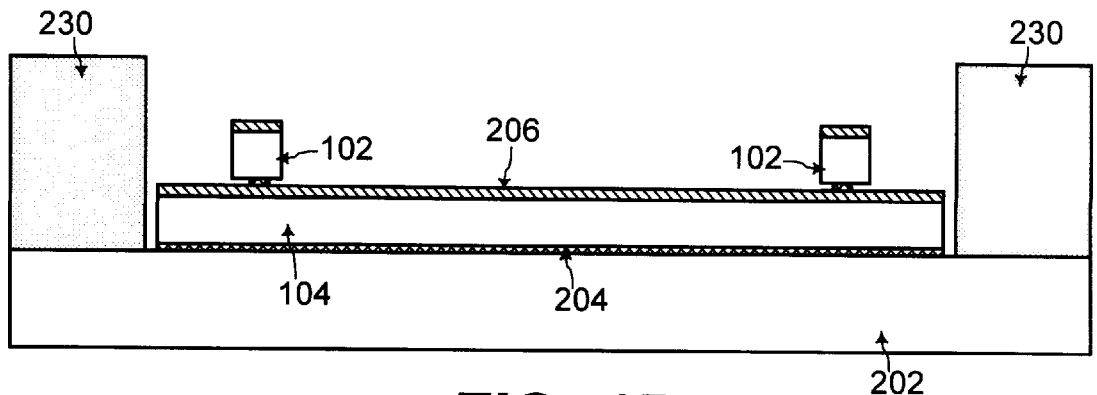
Figure 16:
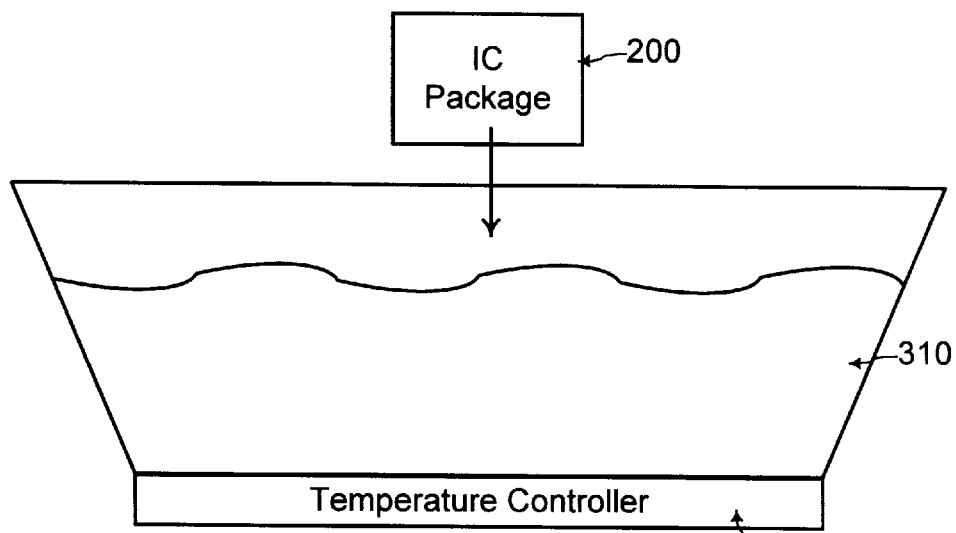

Referring to FIG. 15, the auto-decapper process with the fuming nitric acid ($HNO_3$) may not completely etch the die attach material between the top IC die skeleton and the bottom IC die 104. In that case, in another embodiment of the present invention, referring to FIG. 16, the multichip IC package 200 is immersed within a heated bath of ethylenediamine solution 310 that is heated to a temperature of about 70° Celsius by a temperature controller 312. The multichip IC package 200 is immersed within the heated bath of ethylenediamine solution 310 for a time period in a range of from about 10 minutes to about 12 minutes. The heated bath of ethylenediamine solution 310 dissolves the remaining die attach material between the top IC die skeleton and the bottom IC die 104 until the top IC die skeleton detaches from the bottom IC die 104. In addition, the heated bath of ethylenediamine solution 310 substantially preserves the interconnect structures of the multichip IC package 200.

The foregoing is by way of example only and is not intended to be limiting. For example, the present invention is illustrated for an example IC package with example interconnect structures. The present invention may be used with any other types of IC packages, as would be apparent to one of ordinary skill in the art of integrated circuit manufacture from the description herein. In addition, the material of any structure specified herein is by way of example only.

In another embodiment of the present invention, the plastic material 230 covering the whole first area of the top IC die 102 is first etched in an auto-decapper. In this manner, the first area of the top IC die 102 is exposed such that fault isolation testing may be performed on the top IC die 102. After fault isolation testing on the top IC die 102, a die attach material is applied on the top IC die 102 toward the outer edges of the top IC die 102 such that only the predetermined area 302 of the top IC die 102 is exposed. Then, the process steps for detaching the top IC die 102 from the bottom IC die 104 as described herein with reference to FIGS. 6, 7, 8, 9, 10, 11, and 12 are performed for fault isolation testing on the bottom IC die Furthermore, as will be understood by those skilled in the art, the structures described herein may be made or used in the same way regardless of their position and orientation. Accordingly, it is to be understood that terms and phrases such as "top," "on," and "bottom" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for removing a top IC (integrated circuit) die attached to a bottom IC (integrated circuit) die with a die attach material within a multichip IC (integrated circuit) package, the top IC die having a first area that is smaller than a second area of said bottom IC die, and said top IC die being disposed inward from any edge of said bottom IC die such that a perimeter area of said bottom IC die is outside said top IC die, the method including the steps of:

A. exposing an area of said top IC die, said area being smaller than said first area of said top IC die, and said area being disposed inward from any edge of said top IC die, wherein said first area of said top IC die outside said area remains covered, and wherein said perimeter area of said bottom IC die remains covered;

B. etching said area of said top IC die that is exposed until said die attach material is exposed within said area;

C. exposing said first area of said top IC die outside said area and exposing said perimeter area of said bottom IC die, wherein said first area of said top IC die outside said area forms a top IC die skeleton;

D. etching said die attach material exposed within said area; and

E. etching said die attach material between said top IC die skeleton and said bottom IC die until said top IC die skeleton detaches from said bottom IC die.

2. The method of claim 1, wherein said first area of said top IC die and said perimeter area of said bottom IC die are initially covered with a plastic material of said multichip IC package, and wherein said step A of exposing said area of said top IC die includes the step of:

etching said plastic material from said area on top of said top IC die using an auto-decapper with an etching acid of fuming sulfuric acid ($H_2SO_4$) at a temperature of about 200° Celsius for an etch time in a range of from about 68 seconds to about 75 seconds.

3. The method of claim 1, wherein said step B of etching said area of said top IC die includes the steps of:

etching at least one topside passivation layer of said top IC die;

etching integrated circuit structures fabricated on a semiconductor substrate of said top IC die; and etching said semiconductor substrate of said top IC die until said die attach material below said semiconductor substrate of said top IC die is exposed.

4. The method of claim 3, wherein said at least one topside passivation layer includes silicon nitride (SiN).

5. The method of claim 4, wherein said semiconductor substrate is comprised of silicon, and wherein an etching solution for etching said at least one topside passivation layer and said integrated circuit structures is comprised of hydrofluoric acid (HF).

6. The method of claim 5, wherein said step of etching said semiconductor substrate includes the step of:

immersing said multichip IC package within a heated bath of potassium hydroxide (KOH) solution that is heated to a temperature in a range of from about 110° Celsius to about 120° Celsius for a time period of from about 30 minutes to about 45 minutes;

wherein said heated bath of potassium hydroxide (KOH) solution substantially preserves interconnect structures of said multichip IC package, and wherein said die attach material that is exposed remains substantially preserved within said heated bath of potassium hydroxide (KOH) solution.

7. The method of claim 4, wherein said semiconductor substrate is comprised of silicon, and wherein an etching solution for etching said at least one topside passivation layer is performed using a plasma etch process with fluorine ($CF_4$).

8. The method of claim 7, wherein said step of etching said integrated circuit structures and said semiconductor substrate includes the step of:

immersing said multichip IC package within a heated bath of potassium hydroxide (KOH) solution that is heated to a temperature in a range of from about 110° Celsius to about 120° Celsius for a time period of from about 30 minutes to about 45 minutes;

wherein said heated bath of potassium hydroxide (KOH) solution substantially preserves interconnect structures of said multichip IC package, and wherein said die attach material that is exposed remains substantially preserved within said heated bath of potassium hydroxide (KOH) solution.

9. The method of claim 1, wherein said first area of said top IC die and said perimeter area of said bottom IC die are initially covered with a plastic material of said multichip IC package, and wherein said step C of exposing said first area of said top IC die outside said area and exposing said perimeter area of said bottom IC die includes the step of:

etching said plastic material from said first area of said top IC die outside said area and from said perimeter area of said bottom IC die using an auto-decapper with an etching acid of fuming sulfuric acid ($H_2SO_4$) at a temperature of about 200° Celsius for an etch time in a range of from about 68 seconds to about 75 seconds.

10. The method of claim 9, wherein said die attach material exposed within the area is substantially etched off during said step C of etching, said plastic material from said first area of said top IC die outside said area and from said perimeter area of said bottom IC die.

11. The method of claim 1, wherein said step E of etching said die attach material between said top IC die skeleton and said bottom IC die includes the step of:

etching said die attach material between said top IC die skeleton and said bottom IC die using an auto-decapper with an etching acid of fuming nitric acid ($HNO_3$) at a temperature of about 90° Celsius for an etch time in a range of from about 200 seconds to about 235 seconds.

12. The method of claim 11, further including the step of:

immersing said multichip IC package within a heated bath of ethylenediamine solution that is heated to a temperature of about 70° Celsius for a time period of from about 10 minutes to about 12 minutes if said top IC die skeleton is not detached from said bottom IC die after said step E;

and wherein said heated bath of ethylenediamine solution substantially preserves interconnect structures of said multichip IC package.

13. A method for removing, a top IC (integrated circuit) die attached to a bottom IC (integrated circuit) die with a die attach material within a multichip IC (integrated circuit) package, the top IC die having a first area that is smaller than a second area of said bottom IC die, and said top IC die being disposed inward from any edge of said bottom IC die such that a perimeter area of said bottom IC die is outside said top IC die, the method including the steps of:

A. exposing an area of said top IC die, said area being smaller than said first area of said top IC die, and said area being disposed inward from any edge of said top IC die, wherein said first area of said top IC die and said perimeter area of said bottom IC die are initially covered with a plastic material of said multichip IC package, and wherein said step A includes the step of:

etching said plastic material from said area on top of said top IC die using an auto-decapper with an etching acid of fuming sulfuric acid ($H_2SO_4$) at a temperature of about 200° Celsius for an etch time in a range of from about 68 seconds to about 75 seconds;

B. etching said area of said top IC die that is exposed until said die attach material is exposed within said area, wherein said step B includes the steps of:

etching at least one topside passivation layer of said top IC die using a solution of hydrofluoric acid (HF), wherein said at least one topside passivation layer includes silicon nitride (SiN);

etching integrated circuit structures fabricated on a semiconductor substrate of said top IC die using said solution of hydrofluoric acid (HF); and etching said semiconductor substrate of said top IC die until said die attach material below said semiconductor substrate of said top IC die is exposed, wherein said step of etching said semiconductor substrate includes the step of:

immersing said multichip IC package within a heated bath of potassium hydroxide (KOH) solution that is heated to a temperature in a range of from about 110° Celsius to about 120° Celsius for a time period of from about 30 minutes to about 45 minutes;

wherein said heated bath of potassium hydroxide (KOH) solution substantially preserves interconnect structures of said multichip IC package, and wherein said die attach material that is exposed remains substantially preserved within said heated bath of potassium hydroxide (KOH) solution;

C. exposing said first area of said top IC die outside said area and exposing said perimeter area of said bottom IC die, wherein said first area of said top IC die outside said area forms a top IC die skeleton, wherein said step C includes the step of:

etching said plastic material of said multichip IC package from said first area of said top IC die outside said area and from said perimeter area of said bottom IC die using an auto-decapper with an etching acid of fuming sulfuric acid ($H_2SO_4$) at a temperature of about 200° Celsius for an etch time in a range of from about 68 seconds to about 75 seconds;

D. etching said die attach material exposed within said area, wherein said die attach material exposed within the area is substantially etched off during said step C of etching said plastic material from said first area of said top IC die outside said area and from said perimeter area of said bottom IC die;

E. etching said die attach material between said top IC die skeleton and said bottom IC die until said top IC die skeleton detaches from said bottom IC die, wherein said step E includes the step of:

etching said die attach material between said top IC die skeleton and said bottom IC die using an auto-decapper with an etching acid of fuming nitric acid ($HNO_3$) at a temperature of about 90° Celsius for an etch time in a range of from about 200 seconds to about 235 seconds; and F. immersing said multichip IC package within a heated bath of ethylenediamine solution that is heated to a temperature of about 70° Celsius for a time period of from about 10 minutes to about 12 minutes if said top IC die skeleton is not detached from said bottom IC die after said step E, wherein said heated bath of ethylenediamine solution substantially preserves interconnect structures of said multichip IC package.

* * * * *